United States Patent
Uitterdijk et al.

(10) Patent No.: US 7,372,633 B2
(45) Date of Patent: May 13, 2008

(54) LITHOGRAPHIC APPARATUS, ABERRATION CORRECTION DEVICE AND DEVICE MANUFACTURING METHOD

(75) Inventors: Tammo Uitterdijk, Bilt (NL); Laurentius Catrinus Jorritsma, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/488,172

(22) Filed: Jul. 18, 2006

(65) Prior Publication Data

US 2008/0024874 A1   Jan. 31, 2008

(51) Int. Cl.
G02B 3/00 (2006.01)
G03B 27/42 (2006.01)
(52) U.S. Cl. .......................... 359/649; 355/53
(58) Field of Classification Search ........ 359/649–651; 355/53, 72, 30, 67
See application file for complete search history.

(56) References Cited

U.S. PATENT DOCUMENTS 6,211,944 B1 * 4/2001 Shiraishi ...................... 355/53
6,522,390 B2 * 2/2003 Suzuki et al. ................ 355/53
2004/0174619 A1 9/2004 Beck et al. .................. 359/819
2006/0114437 A1 6/2006 Akhssay et al. ............. 355/55

FOREIGN PATENT DOCUMENTS

EP   0 660 169 B1   4/2000
EP   1 349 201 A1   10/2003

OTHER PUBLICATIONS

European Search Report issued for European Patent Application No. 07252737.7—1226, dated Oct. 19, 2007.

* cited by examiner

*Primary Examiner*—M. Hasan
(74) *Attorney, Agent, or Firm*—Pillsbury Winthrop Shaw Pittman, LLP

(57) ABSTRACT

An aberration correction device useable in lithography comprises two elements, at least one of which is relatively rotatable to the other about, for example, an optical axis. One surface of each element has an aspheric form describable by higher Zernike polynomials. When the two surfaces are rotationally aligned, the device has the optical effect of a plane plate. If there is a small relative rotation of the two elements the effect of the device is a phase shift describable by the derivative of the aspheric form. The correction device may be used to correct aberrations caused by lens heating, especially with illumination modes and pattern types resulting in strong off-axis localized pupil filling in the projection system.

19 Claims, 3 Drawing Sheets

LITHOGRAPHIC APPARATUS, ABERRATION CORRECTION DEVICE AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In order to provide a high throughput, i.e. pattern a large number of substrates per hour, lithographic apparatus normally employ powerful radiation sources. Therefore, although the elements of the projection system, which project the desired pattern onto the substrate, have a high transmissivity or reflectivity, the amount of radiation absorbed by them is not negligible and results in significant heating of the elements, even with a highly effective temperature control system for the projection system. Since this heating is non-uniform it may result in distortion of the shapes of the elements sufficient to cause significant distortion of the projected image. This is a particular problem of projection systems using refractive lenses and is often referred to generally as lens heating, though it also occurs with reflective and catadioptric systems. The term lens heating herein is used generally to refer to heating of one or more optical elements of a projection system, whether those one or more optical elements are transmissive, reflective, or both or whether those one or more optical elements are one or more lenses, one or more mirrors, etc.

Lens heating effects may be calculated in advance using a mathematical model that calculates, for a given pattern to be projected and a given illumination mode, where the projection beam will be localized in the projection system, the heating that will be caused and the resulting aberrations of the projected image. Adjustable optical elements provided in the projection system, for this and other corrections, may be used to introduce compensating aberrations so that the effect of lens heating is at least mitigated. Adjustable optical elements may allow for effective correction of aberrations describable by low order Zernike polynomials, up to Z16. An example of an adjustable optical element, intended for correction of magnification, astigmatism and field curvature, is disclosed in European patent application publication EP 0 660 169 A and comprises two cylindrical lenses with opposite power that can be relatively rotated.

SUMMARY

It is desirable, for example, to provide improved compensation for lens heating effects. In particular, certain combinations of pattern, patterning device type and/or illumination mode, in particular an illumination mode involving localized poles, may not be well compensated for by known adjustable optical elements. Lens heating effects induced by such modes may not be well described by lower order Zernike polynomials and so may not be effectively compensated for by existing adjustable optical elements. An adjustable optical element capable of compensating for higher order Zernike aberrations, especially aberrations caused by lens heating, is desirable.

According to an aspect of the invention, there is provided a lithographic apparatus comprising:

a projection system comprising a plurality of optical elements configured to project a patterned radiation beam onto a target portion of a substrate, and having an aberration correction device disposed therein, the aberration correction device comprising:

a first correction optical element having a first surface, the first surface having a first shape that is not rotationally symmetric about an axis, a second correction optical element having a second surface, the second surface having a second shape, the second shape being substantially complementary to the first shape, and an actuator arranged to adjust a relative rotational position, about the axis, of the first or second correction optical element; and a control circuit arranged to control the actuator to position the first or second correction optical element at a relative rotational position to at least partially compensate for an aberration induced by the effect of a temperature change in one or more of the plurality of optical elements caused by absorption of energy from the radiation beam.

According to an aspect of the invention, there is provided a lithographic apparatus comprising:

a projection system comprising a plurality of optical elements configured to project a patterned radiation beam onto a target portion of a substrate, and having an aberration correction device disposed therein at or near a pupil plane of the projection system, the aberration correction device comprising:

a first correction optical element having a first surface, the first surface having a first shape that is not rotationally symmetric about an axis, a second correction optical element having a second surface, the second surface having a second shape, the second shape being substantially complementary to the first shape, and a holding mechanism arranged to hold the first and second correction optical elements in a desired relative rotational position about the axis.

According to an aspect of the invention, there is provided an aberration correction device comprising:

a first correction optical element having a first surface, the first surface having a first shape that is not rotationally symmetric about an axis;

a second correction optical element having a second surface, the second surface having a second shape, the second shape being substantially complementary to the first shape; and a holding mechanism arranged to hold the first and second correction optical elements in a desired relative rotational position about the axis, wherein the first shape is substantially describable by a Zernike polynomial or a sum of Zernike polynomials, the Zernike polynomial or sum of Zernike polynomials having at least one term containing $\rho$ to the power of 4 or greater or $\theta$ multiplied by an integer greater than or equal to 2, where $\rho$ and $\theta$ are polar coordinates.

According to an aspect of the invention, there is provided an aberration correction device comprising:

a first correction optical element having a first surface, the first surface having a first shape that is not rotationally symmetric about an axis;

a second correction optical element having a second surface, the second surface having a second shape, the second shape being substantially complementary to the first shape; and a holding mechanism arranged to hold the first and second correction optical elements in a desired relative rotational position about the axis, wherein the first shape is substantially describable by a Zernike polynomial or a sum of Zernike polynomials selected from the group comprising:

Z12: $(4.\rho^4-3.\rho^2).\cos(2\theta)$
Z13: $(4.\rho^4-3.\rho^2).\sin(2\theta)$
Z17: $\rho^4.\cos(4\theta)$
Z18: $\rho^4.\sin(4\theta)$
Z28: $(6.\rho^6-5.\rho^4).\cos(4\theta)$
Z29: $(6.\rho^6-5.\rho^4).\sin(4\theta)$, where $\rho$ and $\theta$ are polar coordinates.

According to an aspect of the invention, there is provided a device manufacturing method, comprising:

providing an aberration correction device in a projection system comprising a plurality of optical elements, the aberration correction device comprising:

a first correction optical element having a first surface, the first surface having a first shape that is not rotationally symmetric about an axis, and a second correction optical element having a second surface, the second surface having a second shape, the second shape being substantially complementary to the first shape, wherein the first and second correction optical elements are set at a relative rotational position to at least partially compensate for an aberration induced by the effect of temperature changes in one or more of the plurality of optical elements caused by absorption of energy from a beam of radiation; and projecting a patterned beam of radiation onto a substrate using the projection system.

According to an aspect of the invention, there is provided a device manufacturing method, comprising:

providing an aberration correction device in a projection system comprising a plurality of optical elements, the aberration correction device comprising a first correction optical element having a first surface, the first surface having a first shape that is not rotationally symmetric about an axis, and a second correction optical element having a second surface, the second surface having a second shape, the second shape being substantially complementary to the first shape;

adjusting a relative rotational position, about the axis, of the first or second correction optical element to at least partially compensate for an aberration induced by the effect of a temperature change in one or more of the plurality of optical elements caused by absorption of energy from a radiation beam; and projecting a patterned beam of radiation onto a substrate using the projection system.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
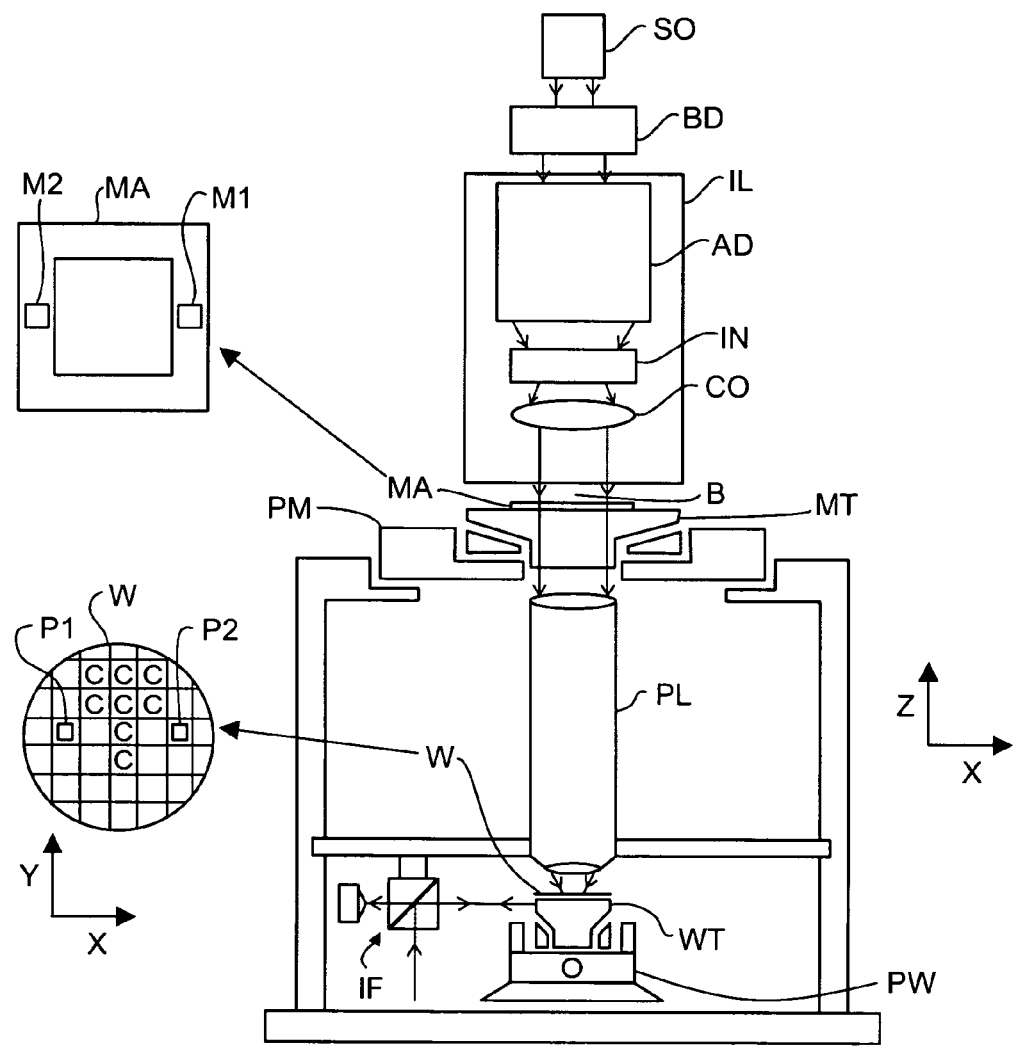
FIG. 1 depicts a lithographic apparatus according to an embodiment of the invention.
Figure 2A:
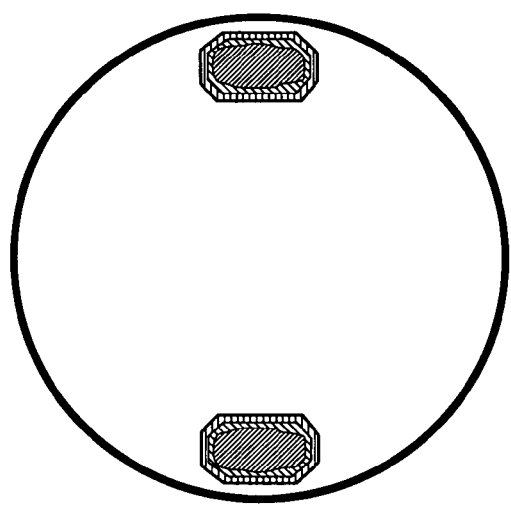
FIGS. 2A to D depict pupil filling in certain exposure types.
Figure 2B:
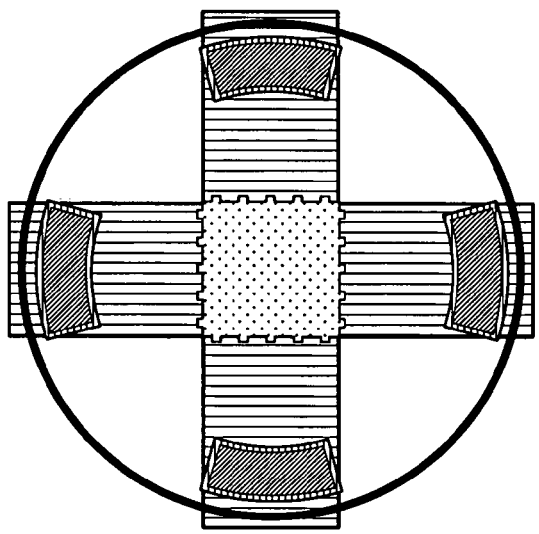
Figure 2C:
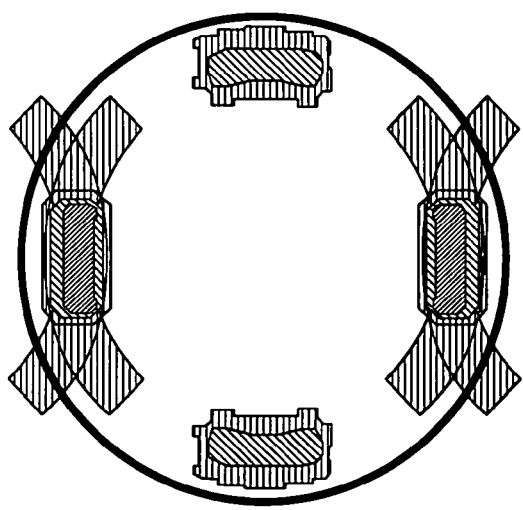
Figure 2D:
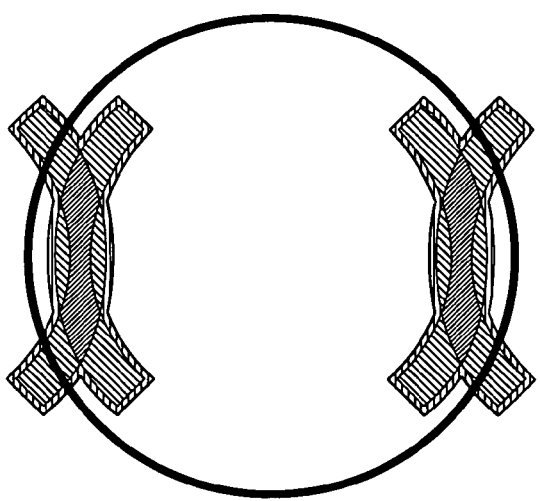

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lens heating effects occurring in certain exposure processes in a lithographic apparatus as described above may not be well corrected for by known adjustable optical elements, in particular exposure processes which result in the projection beam being localized in poles close to the edge of the pupil in the projection system. Examples of problematic exposure processes are those for horizontal gates, contact holes, mixed layers and vertical bit lines. FIGS. 2A to D show pupil filling in respective test cases of these types of exposure processes. Lens heating induced by these exposure processes induce phase errors that may partially be corrected for by existing optical element (e.g., lens) manipulators that correct Zernike polynomials Z5 and Z12, but a 4-wave aberration (Z17) remains and an adjustable optical element to correct this has not been available.

Figure 3:
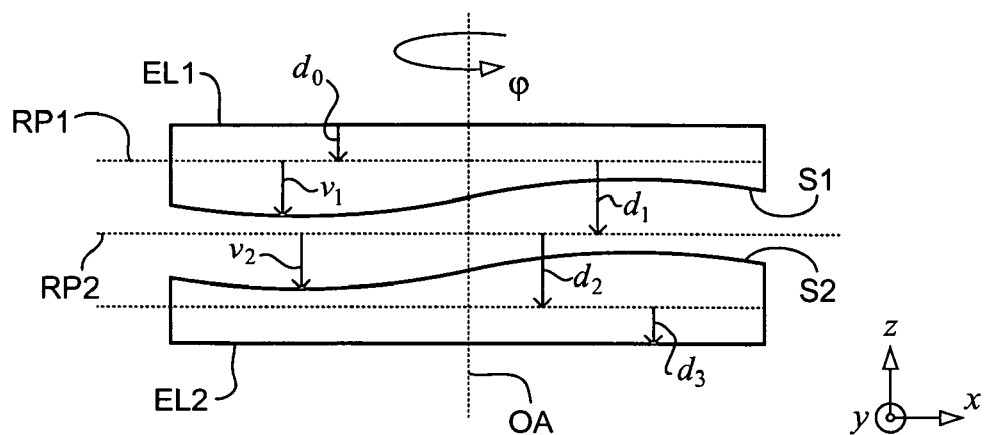
FIG. 3 depicts an adjustable optical element according to an embodiment of the invention.

An aberration correction device 10 according to an embodiment of the invention is shown in FIG. 3. It comprises two optical elements EL1, EL2 which can be rotated relative to one another. They are formed of a material that is transparent and has a refractive index greater than 1 at the wavelength of the exposure radiation to be used (for example, fused silica or $CaF_2$). One surface of each of the elements has an aspheric shape, the two surfaces being complementary. If the two surfaces are aligned, the net effect of the device is that of a plane plate, but if the two surfaces are relatively rotated by a small amount, a phase difference that is a function of radial, $\rho$, and azimuthal, $\theta$, position is introduced. As is shown below, the phase shift function is related to the derivative of the surface shape function. For example, if the surface shape function is an (n+1)-wave polynomial, the phase shift function is substantially equal to an n-wave polynomial. Thus, by providing two complementary 5-wave surfaces, a 4-wave aberration can be achieved. This effect is based on the fact that the sum of a function with a shifted (in this case rotated) version of itself is substantially equal to the derivative of the function. Surface shapes described by functions other than Zernike polynomials can also be used. The other surfaces of the plate may be planar or have an optical power but desirably are rotationally symmetric.

One or more actuators, not shown in FIG. 3, are desirably provided to rotate one or both of the elements EL1, EL2, for two reasons. Firstly a relative rotation is desirable to control the amount of correction induced; for small rotations the correction induced is substantially proportional to the rotation. Secondly, since the correction provided may not be rotationally symmetrical, it is also desirable to adjust the rotational position of the complete device—by small amounts to adjust the correction relative to the axes defined by the patterning device features to be imaged, and in some cases by larger amounts, e.g. so that one device can be used to correct for both x-dipole and y-dipole exposures.

While actuators as described above are desirable to enable rapid setting of the correction device in response to changes of the exposure process, the correction device may also be used where it is not possible to provide them. In particular, an embodiment of the invention may be used with an existing projection system that has a slot for insertion of an exchangeable element. The elements EL1, EL2 may be provided in a frame so that their relative and absolute rotations can be fixed, either permanently or temporarily, to provide a desired correction and then inserted into the projection system via the available slot. Multiple different correction elements may be provided and exchanged, manually or automatically. It is also possible to use multiple correction devices simultaneously to provide more complex corrections.

In an embodiment, the optical elements EL1 and EL2 are disposed in or near a pupil plane of the projection system. The elements may be embodied as plano-aspherical elements having one flat surface and one non-flat (e.g. aspherical) surface. The flat surfaces of the elements may be arranged substantially perpendicular to the optical axis OA of the projection system, as illustrated in FIG. 3.

To explain mathematically the functioning of a device according to an embodiment of the invention, the thicknesses along the optical axis OA of the elements are defined with reference to reference planes RP1 and RP2 shown in FIG. 3. The thicknesses $d_0$, $d_1$, $d_2$, and $d_3$, are constant design parameters, i.e., independent of the x,y coordinates in FIG. 3. In contrast, the thicknesses $v_1$ and $v_2$ are non-constant functions of x and y or, equivalently, $\rho$ and $\theta$. These spatially varying thicknesses $v_1$ and $v_2$ are referred to as surface shape functions. The surface shape functions $v_1$ and $v_2$ define generally aspherical or non-flat shapes of the respective surfaces with respect to reference planes RP1 and RP2.

The optical path along a ray propagating parallel the optical axis OA includes an optical path length OP given by $$OP = nd_0 + nv_1 + (d_1 - v_1) + v_2 + n(d_2 - v_2) + nd_3, \quad (1)$$

where n is the index of refraction of the material of the elements EL1 and EL2.

The spatially variable part $OP_{var}$ of the optical path OP is determined by the surface shape functions $v_1$ and $v_2$:

$$OP_{var} = (n-1)(v_1 - v_2). \quad (2)$$

Below, polar coordinates $\rho$ and $\theta$ are defined with respect to the x,y coordinates in FIG. 1; $\rho$ is the radial coordinate of a point in the x,y-plane and $\theta$ is the angular coordinate of that point. The surface shape functions may be written in terms of these polar coordinates:

$$v_1 = v_1(\rho, \theta),$$

$$v_2 = v_2(\rho, \theta). \quad (3)$$

In the following, the aspherical surfaces S1 and S2 are assumed to have an identical topography along the optical axis OA (i.e., to have an identical height profile) when they are rotationally aligned:

$$v_1(\rho, \theta) = v_2(\rho, \theta) \text{ (rotationally aligned)}. \quad (4)$$

When the element EL2 is rotated over an angle $\phi$ about the optical axis OA, the spatially variable part $OP_{var}$ of the optical path OP is given by (in view of Equation (2))

$$OP_{var} = (n-1)(v_1(\rho, \theta) - v_2(\rho, \theta + \phi)). \quad (5)$$

The differential nature of Equation (5), in combination with the equality as expressed in Equation (4) implies that in first approximation, valid for sufficiently small rotations $\varphi$, the optical path length $OP_{var}$ is given by $$OP_{var} \approx -(n-1)\frac{\partial v_2(\rho, \theta)}{\partial \theta}\varphi. \tag{6}$$

This variation of optical path length is related to a corresponding variation of phase $Wa_{OP}$ of an optical wave traversing the elements EL1 and EL2 through:

$$Wa_{OP}(\varphi) = \frac{OP_{var}}{\lambda} \approx -\frac{1}{\lambda}(n-1)\frac{\partial v_2(\rho, \theta)}{\partial \theta}\varphi \tag{7}$$

So, in this approximation, a rotation over $\varphi$ yields a phase aberration which is linearly proportional to $\varphi$. Therefore, a mutual rotation over an angle $\varphi$ of the elements EL1 and EL2 can conveniently be used to adjust a phase aberration in the pupil of the projection system.

An induced wave aberration Wa can in principle be compensated by a rotation of the element EL2 with respect to the element EL1 provided that the surface shape function $v_2$ is embodied such that the following equation is satisfied:

$$Wa(\rho, \theta) = (n-1)A\frac{1}{\lambda}\frac{\partial v_2(\rho, \theta)}{\partial \theta}, \tag{9}$$

where A is a dimensionless constant. By choosing the mutual rotation $\varphi$ equal to A, the phase variation $Wa_{OP}$ induced by the variable part $OP_{var}$ then has just the opposite value of the wave aberration Wa:

$$Wa_{OP}(A) = -Wa. \tag{10}$$

An embodiment of the surface shape functions $v_2$ and $v_1$ whereby a compensation as described above is accomplished, is given by $$v_2(\rho, \theta) = \frac{\lambda}{A(n-1)}\int_0^\theta Wa(\rho, \theta')d\theta' \tag{11}$$

A wave aberration $Wa(\rho, \theta)$ expressing an aberration as a wave-phase error (i.e., as a fraction of wavelength $\lambda$) is conventionally written in terms of orthonormal Zernike circle polynomials $Z_j(\rho, \theta)$ and corresponding aberration coefficients $a_j$ weighting the presence of the respective Zernike polynomial:

$$Wa(\rho, \theta) = \sum_j a_j Z_j(\rho, \theta) \tag{12}$$

(see, for example, "Optical imaging in projection microlithography", Alfred Kwok-Kit Wong, Tutorial texts in Optical Engineering, Vol. TT66, 2005, SPIE Press, Bellingham, Wash. USA, chapter 7.3). For example, with the use of an off-axis multipole illumination mode, wave aberration induced by lens heating, denoted by $Wa_{LH}$, features a presence of a limited number of Zernike aberration contributions beyond tolerance.

For example, in the case of x- and y-dipole illumination, typically the optical, lens-heating induced aberration is dominated by a combination of HV-astigmatism ($Z_5$ and $Z_{12}$), whereby the respective Zernike orthonormal functions are:

$$Z_5 = \sqrt{6}\rho^2 \cos 2\theta$$

$$Z_{12} = \sqrt{10}(4\rho^4 - 3\rho^2)\cos 2\theta \tag{13}$$

The wave-aberration is given by $$Wa_{LH}(\rho, \theta) = a_5 Z_5 + a_{12} Z_{12} \tag{14}$$

where $a_5$ and $a_{12}$ are weight factors weighting the contribution of the Zernike aberrations $Z_5$ and $Z_{12}$.

Then, the surface shape required for compensation is given by $$v_2(\rho, \theta) = \frac{\lambda}{A(n-1)}\left(a_5\sqrt{6}\rho^2 + a_{12}\sqrt{10}(4\rho^4 - 3\rho^2)\right)\int_0^\theta \cos 2\theta' d\theta' \tag{15}$$

$$= \frac{\lambda}{2A(n-1)}(a_5\sqrt{6}\rho^2 + a_{12}\sqrt{10}(4\rho^4 - 3\rho^2))\sin 2\theta$$

$$= \frac{\lambda}{2A(n-1)}(a_5 Z_6 + a_{12} Z_{13}).$$

To arrive at a balance between the lens-heating induced aberration and the compensating aberration, as expressed in Equation (10), as before a mutual rotation $\varphi$ equal to A can be applied.

Typically lens-heating effects are time dependent in accordance with one or more exponentials characterized by one or more respective time constants. Then, in this example $a_5$ and $a_{12}$ are functions of time. Generally there is a dominant single common time dependency f(t), so that $a_5 = a_5(t) = a_5(0)f(t)$ and similarly $a_{12} = a_{12}(0)f(t)$. The time dependency may be accounted for in the compensation of aberration by applying a time dependent mutual rotation $\varphi$ equal to A/f(t), whereby f(t) may include at least one exponential function.

According to an embodiment of the invention, there is provided an assembly of elements EL1 and EL2 as described above, configured to compensate for lens-heating effects characteristic for the use of quadrupole illumination modes. With quadrupole illumination, there is typically a lens-heating induced aberration dominated by "clover" or "four wave" aberration, which can be expressed as $$Wa_{LH}(\rho, \theta) = a_{14} Z_{14} \tag{16}$$

whereby $$Z_{14} = \sqrt{10}\rho^4 \sin 4\theta, \tag{17}$$

and $a_{14} = a_{14}(0)f(t)$.

Four wave aberration is particularly hard to compensate using conventional optical element manipulators within the projection system because of the relative densely spaced aberration phase changes characteristic for four wave aberration. According to an embodiment of the present invention, the aberration can be compensated by providing elements with a surface shape given by $$v_2(\rho, \theta) = \frac{\lambda}{A(n-1)}(a_{14}(0)\sqrt{10}\rho^4)\int_0^\theta \sin 4\theta' d\theta' \tag{18}$$

$$= -\frac{\lambda}{4A(n-1)}a_{14}(0)Z_{15}(\rho, \theta),$$

in analogy with Equation (15), and by applying a time dependent mutual rotation φ equal to A/f(t). Such an element can also be used with dipole illumination to compensate for the 4-wave aberrations which are the main aberrations remaining after correction of the HV-astigmatism terms, as described above.

It is noted that there are multiple definitions of the Zernike polynomials, e.g. normalised and not-normalised, and different numbering schemes. The functioning of an embodiment of the present invention does not depend on a specific definition of the Zernike polynomials however the explanation set out above assumes the following definitions, unless otherwise specified:

Z2: $\rho.\cos(\theta)$
Z3: $\rho.\sin(\theta)$
Z4: $2.\rho^2-1$
Z5: $\rho^2.\cos(2.\theta)$
Z6: $\rho^2.\sin(2.\theta)$
Z7: $(3.\rho^3-2.\rho).\cos(\theta)$
Z8: $(3\rho^3-2.\rho).\sin(\theta)$
Z9: $6.\rho^4-6.\rho^2+1$
Z12: $(4.\rho^4-3.\rho^2).\cos(2\theta)$
Z13: $(4.\rho^4-3.\rho^2).\sin(2\theta)$
Z17: $\rho^4.\cos(4\theta)$
Z18: $\rho^4.\sin(4\theta)$
Z28: $(6.\rho^6-5.\rho^4).\cos(4\theta)$
Z29: $(6.\rho^6-5.\rho^4).\sin(4\theta)$.

Figure 4:
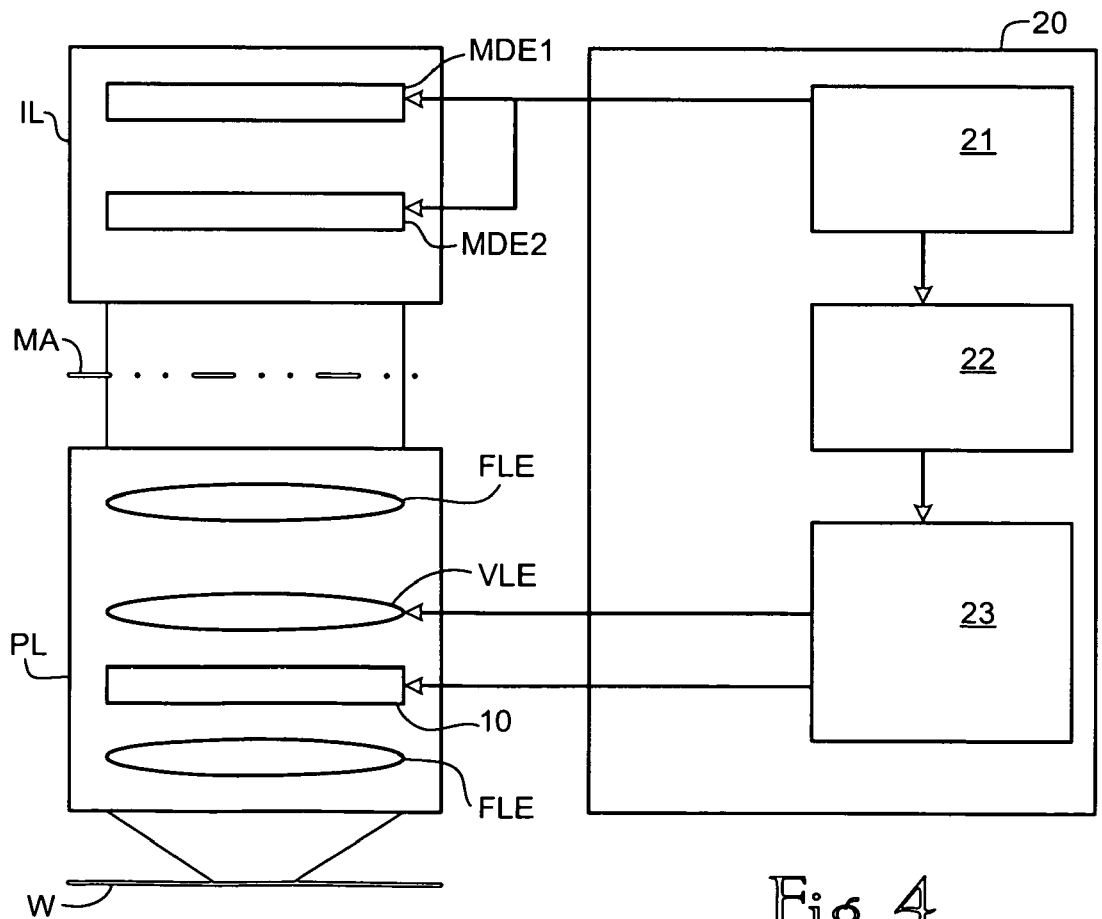
FIG. 4 depicts selected control and optical arrangements in the apparatus of FIG. 1.

The integration of an aberration correction device according to an embodiment of the invention into a lithographic apparatus such as shown in FIG. 1 is described below with reference to FIG. 4. The apparatus has a control system 20 which controls and coordinates the whole apparatus, including adjustable elements in the illumination and projection system. Included in the control system is an input section 21 which receives information as to the desired illumination mode, which will be implemented by adjustor AD, and the form of the pattern embodied in patterning device (e.g. mask) MA. This information is passed to calculation section 22 which includes a mathematical model of the projection system, or a set of empirical rules, that enables calculation of the local beam intensity at various places in the projection system, the absorption and lens heating that will result, the aberrations that will therefore be induced and the corrections that it would be desirable to apply. Software to do this is known. The desired corrections are passed to controller 23 which controls one or more actuators to adjust the aberration correction device 10 and any other variable optical element that may be provided in the projection system PL, the projection system PL having other fixed optical elements FLE such as lenses.

The lens heating correction to be applied may be divided between one or more available variable optical elements VLE and the aberration correction device 10 as convenient, for example low order corrections may be applied by the variable optical element VLE and higher order corrections by the aberration correction device 10. The lens heating corrections may be combined with other corrections to be applied and may be time-varying. Calculation of the corrections may be done in real time or off-line in advance.

Multiple aberration correction devices 10 may be provided—these may be simultaneously positioned in the path of the projection beam and/or exchangeable. As mentioned above, in an embodiment, the aberration correction device 10 is located in or near a pupil plane of the projection system. Where there are multiple pupil planes, any or all may have aberration correction devices 10.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
a projection system comprising a plurality of optical elements configured to project a patterned radiation beam onto a target portion of a substrate, and having an aberration correction device disposed therein, the aberration correction device comprising:

a first correction optical element having a first surface, the first surface having a first shape that is not rotationally symmetric about an optical axis, a second correction optical element along the axis having a second surface, the second surface having a second shape, the second shape being substantially complementary to the first shape, and an actuator arranged to adjust a relative rotational position, about the axis, of the first or second correction optical element; and a control circuit arranged to control the actuator to position the first or second correction optical element at a relative rotational position to at least partially compensate for an aberration induced by the effect of a temperature change in one or more of the plurality of optical elements caused by absorption of energy from the radiation beam.

2. The apparatus of claim 1, wherein the first shape is substantially describable by a Zernike polynomial or a sum of Zernike polynomials, the Zernike polynomial or sum of Zernike polynomials having at least one term containing $\rho$ to the power of 4 or greater or $\theta$ multiplied by an integer greater than or equal to 2, where $\rho$ and $\theta$ are polar coordinates.

3. The apparatus of claim 1, wherein the first shape is substantially describable by a Zernike polynomial or a sum of Zernike polynomials selected from the group comprising:

Z12: $(4.\rho^4 - 3.\rho^2).\cos(2\theta)$
Z13: $(4.\rho^4 - 3.\rho^2).\sin(2\theta)$
Z17: $\rho^4.\cos(4\theta)$
Z18: $\rho^4.\sin(4\theta)$
Z28: $(6.\rho^6 - 5.\rho^4).\cos(4\theta)$
Z29: $(6.\rho^6 - 5.\rho^4).\sin(4\theta)$ where $\rho$ and $\theta$ are polar coordinates.

4. The apparatus of claim 1, further comprising an illumination system arranged to illuminate a patterning device with a controllable illumination mode, the patterning device being arranged to impart a pattern to the radiation beam, wherein the control circuit comprises:

an input section arranged to receive information of the pattern and the illumination mode to be used for an exposure process; and a calculation section responsive to the information of the pattern and the illumination mode and arranged to calculate a relative rotational position for the first or second correction optical element to at least partially compensate for the aberration induced by effect of a temperature change in one or more of the plurality of optical elements caused by absorption of energy from the radiation beam.

5. A lithographic apparatus comprising:

a projection system comprising a plurality of optical elements configured to project a patterned radiation beam onto a target portion of a substrate, and having an aberration correction device disposed therein at or near a pupil plane of the projection system, the aberration correction device comprising:

a first correction optical element having a first surface, the first surface having a first shape that is not rotationally symmetric about an optical axis, a second correction optical element along the axis having a second surface, the second surface having a second shape, the second shape being substantially complementary to the first shape, and a holding mechanism arranged to hold the first and second correction optical elements in a desired relative rotational position about the axis.

6. The apparatus of claim 5, wherein the desired relative rotational position is arranged to at least partially compensate for an aberration induced by the effect of a temperature change in one or more of the plurality of optical elements caused by absorption of energy from the radiation beam.

7. The apparatus of claim 5, wherein the first shape is substantially describable by a Zernike polynomial or a sum of Zernike polynomials, the Zernike polynomial or sum of Zernike polynomials having at least one term containing $\rho$ to the power of 4 or greater or $\theta$ multiplied by an integer greater than or equal to 2, where $\rho$ and $\theta$ are polar coordinates.

8. The apparatus of claim 5, wherein the first shape is substantially describable by a Zernike polynomial or a sum of Zernike polynomials selected from the group comprising:

Z12: $(4.\rho^4 - 3.\rho^2).\cos(2\theta)$
Z13: $(4.\rho^4 - 3.\rho^2).\sin(2\theta)$
Z17: $\rho^4.\cos(4\theta)$
Z18: $\rho^4.\sin(4\theta)$
Z28: $(6.\rho^6 - 5.\rho^4).\cos(4\theta)$
Z29: $(6.\rho^6 - 5.\rho^4).\sin(4\theta)$ where $\rho$ and $\theta$ are polar coordinates.

9. The apparatus of claim 5, further comprising:

an illumination system arranged to illuminate a patterning device with a controllable illumination mode, the patterning device being arranged to impart a pattern to the radiation beam; and a control circuit comprising:

an input section arranged to receive information of the pattern and the illumination mode to be used for an exposure process; and a calculation section responsive to the information of the pattern and the illumination mode and arranged to calculate the desired relative rotational position to at least partially compensate for an aberration induced by the effect of a temperature change in one or more of the plurality of optical elements caused by absorption of energy from the radiation beam.

10. A lithographic apparatus comprising:

a projection system comprising a plurality of optical elements configured to project a patterned radiation beam onto a target portion of a substrate, and having an aberration correction device disposed therein, the aberration correction device comprising:

a first correction optical element having a first surface, the first surface having a first shape that is not rotationally symmetric about an axis, a second correction optical element having a second surface, the second surface having a second shape, the second shape being substantially complementary to the first shape, and a holding mechanism arranged to hold the first and second correction optical elements in a desired relative rotational position about the axis, wherein the first shape is substantially describable by a Zernike polynomial or a sum of Zernike polynomials, the Zernike polynomial or sum of Zernike polynomials having at least one term containing $\rho$ to the power of 4 or greater or $\theta$ multiplied by an integer greater than or equal to 2, where $\rho$ and $\theta$ are polar coordinates.

11. The apparatus of claim 10, further comprising an illumination system arranged to illuminate a patterning device with a controllable illumination mode, the patterning device being arranged to impart a pattern to the radiation beam, wherein the control circuit comprises:

an input section arranged to receive information of the pattern and the illumination mode to be used for an exposure process; and a calculation section responsive to the information of the pattern and the illumination mode and arranged to calculate a relative rotational position for the first or second correction optical element to at least partially compensate for the aberration induced by effect of a temperature change in one or more of the plurality of optical elements caused by absorption of energy from the radiation beam.

12. The apparatus of claim 11, further comprising an actuator arranged to adjust a relative rotational position, about the axis, of the first or second correction optical element, and a control circuit arranged to control the actuator to position the first or second correction optical element at a relative rotational position.

13. A lithographic apparatus comprising:

a projection system comprising a plurality of optical elements configured to project a patterned radiation beam onto a target portion of a substrate, and having an aberration correction device disposed therein, the aberration correction device comprising:

a first correction optical element having a first surface, the first surface having a first shape that is not rotationally symmetric about an axis, a second correction optical element having a second surface, the second surface having a second shape, the second shape being substantially complementary to the first shape, and a holding mechanism arranged to hold the first and second correction optical elements in a desired relative rotational position about the axis, wherein the first shape is substantially describable by a Zernike polynomial or a sum of Zernike polynomials selected from the group comprising:

Z12: $(4.\rho^4-3.\rho^2).\cos(2\theta)$
Z13: $(4.\rho^4-3.\rho^2).\sin(2\theta)$
Z17: $\rho^4.\cos(4\theta)$
Z18: $\rho^4.\sin(4\theta)$
Z28: $(6.\rho^6-5.\rho^4).\cos(4\theta)$
Z29: $(6.\rho^6-5.\rho^4).\sin(4\theta)$ where $\rho$ and $\theta$ are polar coordinates.

14. The apparatus of claim 13, further comprising an illumination system arranged to illuminate a patterning device with a controllable illumination mode, the patterning device being arranged to impart a pattern to the radiation beam, wherein the control circuit comprises:

an input section arranged to receive information of the pattern and the illumination mode to be used for an exposure process; and a calculation section responsive to the information of the pattern and the illumination mode and arranged to calculate a relative rotational position for the first or second correction optical element to at least partially compensate for the aberration induced by effect of a temperature change in one or more of the plurality of optical elements caused by absorption of energy from the radiation beam.

15. The apparatus of claim 13, further comprising an actuator arranged to adjust a relative rotational position, about the axis, of the first or second correction optical element, and a control circuit arranged to control the actuator to position the first or second correction optical element at a relative rotational position.

16. A lithographic apparatus comprising:

a projection system comprising a plurality of optical elements configured to project a patterned radiation beam onto a target portion of a substrate, and having an aberration correction device, the aberration correction device comprising:

a first correction optical element having a first surface, the first surface having a first shape that is not rotationally symmetric about an optical axis, a second correction optical element along the axis having a second surface, the second surface having a second shape, the second shape being substantially complementary to the first shape, and a holding mechanism arranged to hold the first and second correction optical elements in a relative rotational position about the axis to at least partially compensate for an aberration induced by the effect of a temperature change in one or more of the plurality of optical elements caused by absorption of energy from a beam of radiation.

17. The apparatus of claim 16, wherein the first shape is substantially describable by a Zernike polynomial or a sum of Zernike polynomials, the Zernike polynomial or sum of Zernike polynomials having at least one term containing $\rho$ to the power of 4 or greater or $\theta$ multiplied by an integer greater than or equal to 2, where $\rho$ and $\theta$ are polar coordinates.

18. The apparatus of claim 16, wherein the first shape is substantially describable by a Zernike polynomial or a sum of Zernike polynomials selected from the group comprising:

Z12: $(4.\rho^4-3.\rho^2).\cos(2\theta)$
Z13: $(4.\rho^4-3.\rho^2).\sin(2\theta)$
Z17: $\rho^4.\cos(4\theta)$
Z18: $\rho^4.\sin(4\theta)$
Z28: $(6.\rho^6-5.\rho^4).\cos(4\theta)$
Z29: $(6.\rho^6-5.\rho^4).\sin(4\theta)$ where $\rho$ and $\theta$ are polar coordinates.

19. The apparatus of claim 16, further comprising an illumination system arranged to illuminate a patterning device with a controllable illumination mode, the patterning device being arranged to impart a pattern to the radiation beam, wherein the control circuit comprises:

an input section arranged to receive information of the pattern and the illumination mode to be used for an exposure process; and a calculation section responsive to the information of the pattern and the illumination mode and arranged to calculate a relative rotational position for the first or second correction optical element to at least partially compensate for the aberration induced by effect of a temperature change in one or more of the plurality of optical elements caused by absorption of energy from the radiation beam.

* * * * *